United States Patent
Li (10) Patent No.: US 7,734,983 B2
(45) Date of Patent: Jun. 8, 2010

(54) INPUT CONTROL DEVICE AND INPUT CONTROL METHOD

(75) Inventor: Jifeng Li, Beijin (CN)

(73) Assignee: Panasonic Corporation, Osaka (JP)

( * ) Notice: Subject to any disclaimer, the term of this patent is extended or adjusted under 35 U.S.C. 154(b) by 590 days.

(21) Appl. No.: 10/573,255

(22) PCT Filed: Sep. 17, 2004

(86) PCT No.: PCT/JP2004/013686

§ 371 (c)(1),
(2), (4) Date: Mar. 23, 2006

(87) PCT Pub. No.: WO2005/031982

PCT Pub. Date: Apr. 7, 2005

(65) Prior Publication Data

US 2007/0022356 A1    Jan. 25, 2007

(30) Foreign Application Priority Data

Sep. 25, 2003  (JP)  ............................. 2003-333489

(51) Int. Cl.
*H03M 13/00* (2006.01)

(52) U.S. Cl. ..................... 714/755; 714/752; 714/795; 370/253

(58) Field of Classification Search ................. 714/755, 714/786, 752, 804, 795, 751; 370/253
See application file for complete search history.

(56) References Cited

U.S. PATENT DOCUMENTS

| 4,878,230 | A | | 10/1989 | Murakami et al. | |
|---|---|---|---|---|---|
| 5,983,383 | A | * | 11/1999 | Wolf | ........................... 714/755 |
| 6,126,310 | A | * | 10/2000 | Osthoff et al. | ............... 714/751 |
| 6,195,337 | B1 | * | 2/2001 | Nystrom et al. | ............. 370/252 |
| 6,625,179 | B1 | | 9/2003 | Doetsch et al. | |

(Continued)

FOREIGN PATENT DOCUMENTS

EP    1317070    6/2003

(Continued)

OTHER PUBLICATIONS

PCT International Search Report dated Dec. 21, 2004.

(Continued)

*Primary Examiner*—Sam Rizk
(74) *Attorney, Agent, or Firm*—Dickinson Wright PLLC (57) ABSTRACT

An input control apparatus capable of suppressing characteristic deterioration, reducing the circuit scale of a turbo decoder and effectively using memory of the turbo decoder. In this apparatus, control section (110) acquires information on a coding rate and coding block length of a received signal, determines the number of bits of systematic part Y1, and parity parts Y2 and Y3 in accordance with the coding rate and/or coding block length and so that the number of bits of one sequence of the parity parts falls below the number of bits of systematic part Y1 and controls bit number reduction section (109) so that the determined number of bits is obtained. Bit number reduction section (109) reduces the number of bits of systematic part Y1, and parity parts Y2 and Y3 output from separation section (108) under the control of control section (110) and decoder (111) performs turbo decoding using each sequence reduced by bit number reduction section (109).

6 Claims, 6 Drawing Sheets

U.S. PATENT DOCUMENTS

| | | | |
|---|---|---|---|
| 6,751,772 B1 * | 6/2004 | Kim et al. ............... | 714/786 |
| 6,766,489 B1 | 7/2004 | Piret et al. | |
| 7,072,307 B2 * | 7/2006 | Tong et al. ............... | 370/253 |
| 7,143,336 B1 * | 11/2006 | Moon et al. ............... | 714/804 |
| 7,180,952 B1 * | 2/2007 | Gerlach et al. ............ | 375/259 |
| 7,210,089 B2 * | 4/2007 | Xu et al. .................. | 714/751 |
| 7,260,770 B2 * | 8/2007 | Stewart et al. ............ | 714/790 |
| 2003/0014711 A1 | 1/2003 | Yuan | |
| 2004/0180695 A1 | 9/2004 | Sano | |
| 2005/0235190 A1 * | 10/2005 | Miyazaki et al. .......... | 714/748 |
| 2006/0218459 A1 * | 9/2006 | Hedberg .................. | 714/752 |

FOREIGN PATENT DOCUMENTS

| | | |
|---|---|---|
| JP | 646805 | 7/1988 |
| JP | 09186608 | 7/1997 |
| JP | 2000156646 | 6/2000 |
| JP | 2002517917 | 6/2002 |
| JP | 2002271209 | 9/2002 |
| JP | 2003101473 | 4/2003 |

OTHER PUBLICATIONS

C. Berrou et al.; "Near Optimum Error Correcting Coding And Decoding: Turbo-Codes," IEEE Transactions on Communications, vol. 44, No. 10, Oct. 1996, pp. 1261-1271.

Supplementary Partial European Search Report dated Sep. 18, 2006.

D. MacKay, "Shortened Turbo Codes," Internet Article, XP002397597, www.cs.toronto.edu/{mackay/muleisit.ps.gz, 1 page total, Sep. 24, 1996.

* cited by examiner

INPUT CONTROL DEVICE AND INPUT CONTROL METHOD

TECHNICAL FIELD

The present invention relates to an input control apparatus and input control method for quantizing data used for decoding.

BACKGROUND ART

Figure 1:
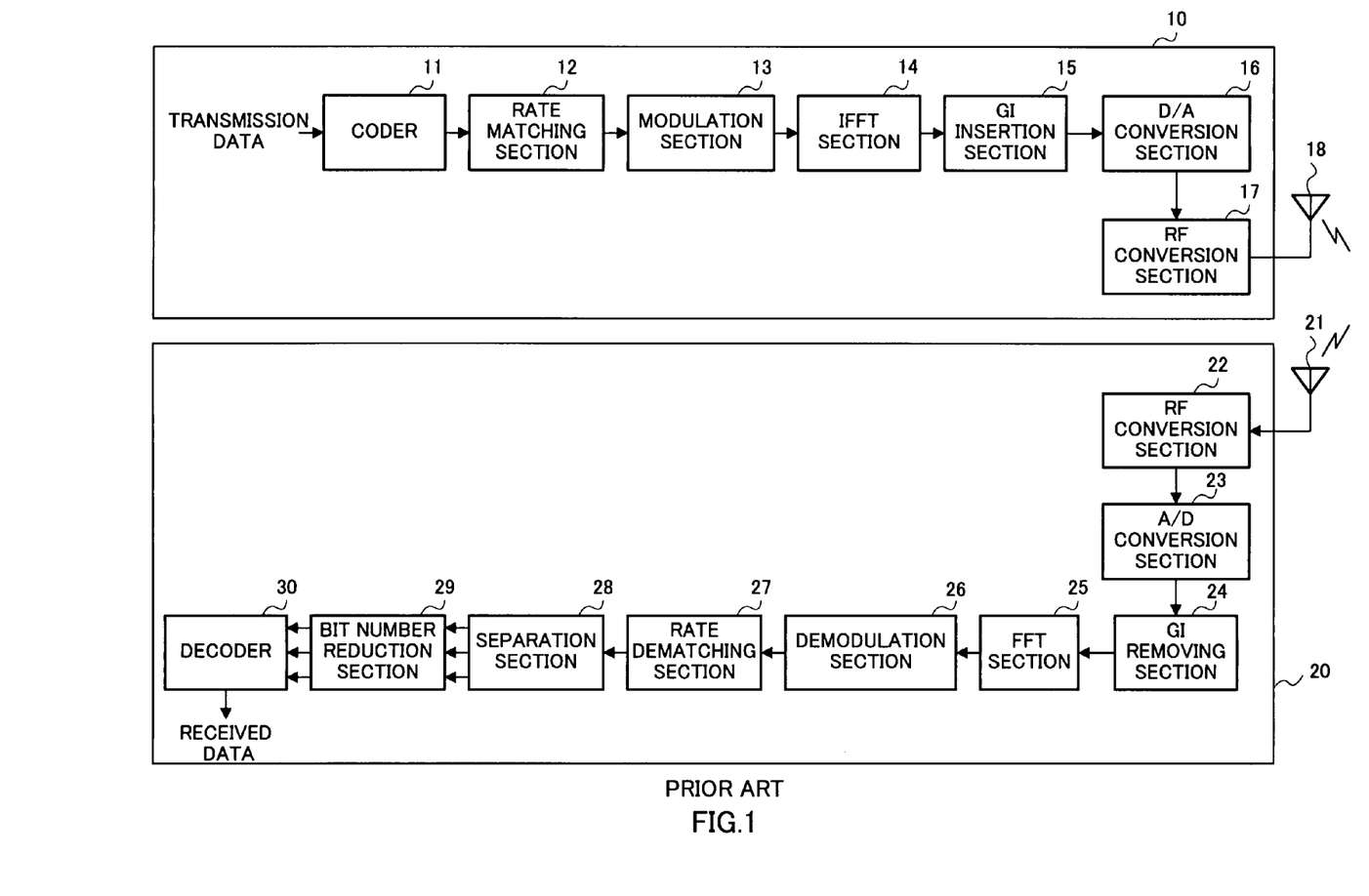
FIG. 1 is a block diagram showing the configuration of a conventional OFDM transmission apparatus and OFDM reception apparatus.

FIG. 1 is a block diagram showing the configuration of a conventional OFDM (Orthogonal Frequency Division Multiplex) transmission apparatus 10 and OFDM reception apparatus 20. First, the configuration of OFDM transmission apparatus 10 will be explained. Transmission data of a bit sequence is subjected to channel coding (turbo coding) by coder 11, and the coded signal is subjected to data iteration processing and puncturing processing (rate matching processing) by rate matching section 12. The signal after the rate matching processing is subjected to data modulation mapping by modulation section 13 and output to IFFT (Inverse Fast Fourier Transform) section 14.

The signal output from modulation section 13 is subjected to an inverse fast Fourier transform by IFFT section 14, and an OFDM signal is thereby formed and a guard interval is inserted into the OFDM signal by GI (Guard Interval) insertion section 15. The OFDM signal with the guard interval inserted is converted from a digital signal to an analog signal by D/A conversion section 16, and the analog signal is up-converted to a radio frequency by RF (Radio Frequency) conversion section 17 and sent to OFDM reception apparatus 20 through antenna 18.

Next, the configuration of OFDM reception apparatus 20 will be explained. Noise is superimposed on the signal sent from OFDM transmission apparatus 10 over the propagation path and the signal is received by antenna 21. The signal received by antenna 21 is down-converted from a radio frequency to an intermediate frequency by RF conversion section 22, separated (subjected to quadrature detection) into signals of I component and Q component channels and then output to A/D conversion section 23. The signals of the I component and Q component channels are converted from analog to digital by A/D conversion section 23, and with guard intervals removed by GI removing section 24, the digital signals are output to FFT (Fast Fourier Transform) section 25.

The signals output from GI removing section 24 are separated into sequences in subcarrier units by FFT section 25 and the separated signals are demodulated by demodulation section 26. The demodulated signals are subjected to rate dematching processing by rate dematching section 27 and the signals subjected to the rate dematching processing are separated into three sequences by separation section 28. The same number of bits are deleted from the three separated sequences by bit number reduction section 29 and each sequence from which the bits have been deleted is subjected to channel decoding (turbo decoding) by decoder 30 and received data is thereby obtained.

Figure 2:
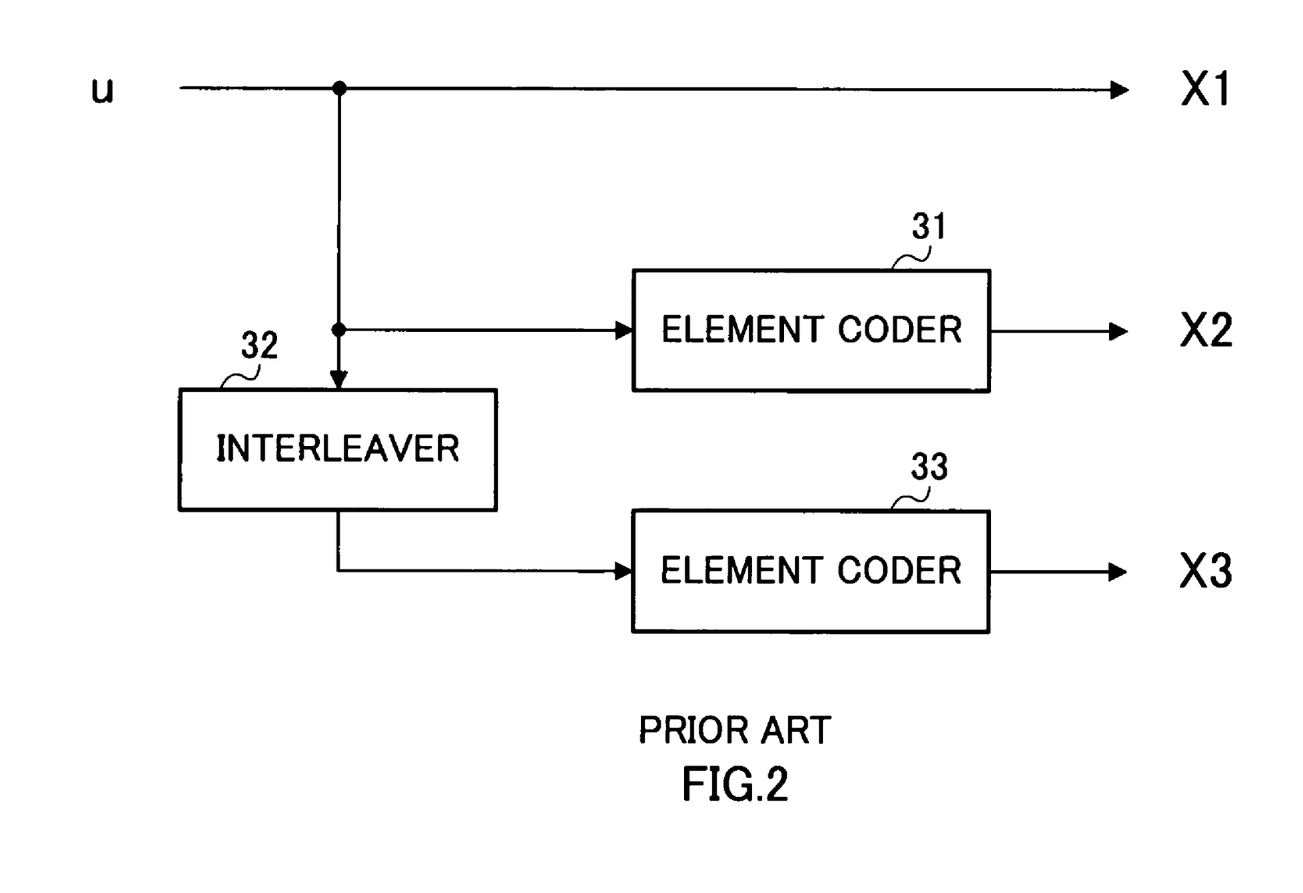
FIG. 2 is a block diagram showing the internal configuration of a coder of a conventional OFDM transmission apparatus.

FIG. 2 is a block diagram showing the internal configuration of coder 11 of OFDM transmission apparatus 10. In this figure, systematic bit sequence (transmission data) u is output as systematic bit sequence X1 as is, while it is also input to element coder 31 and interleaver 32. Element coder 31 generates a codeword for input systematic bit sequence u. The generated codeword is output as parity bit sequence X2.

Interleaver 32 has a conversion function for converting a read order corresponding to a write order and outputs input systematic bit sequence u to element coder 33 in a different order from the input order. Element coder 33 generates a codeword for the bit sequence output from interleaver 32. The generated codeword is output as parity bit sequence X3.

Figure 3:
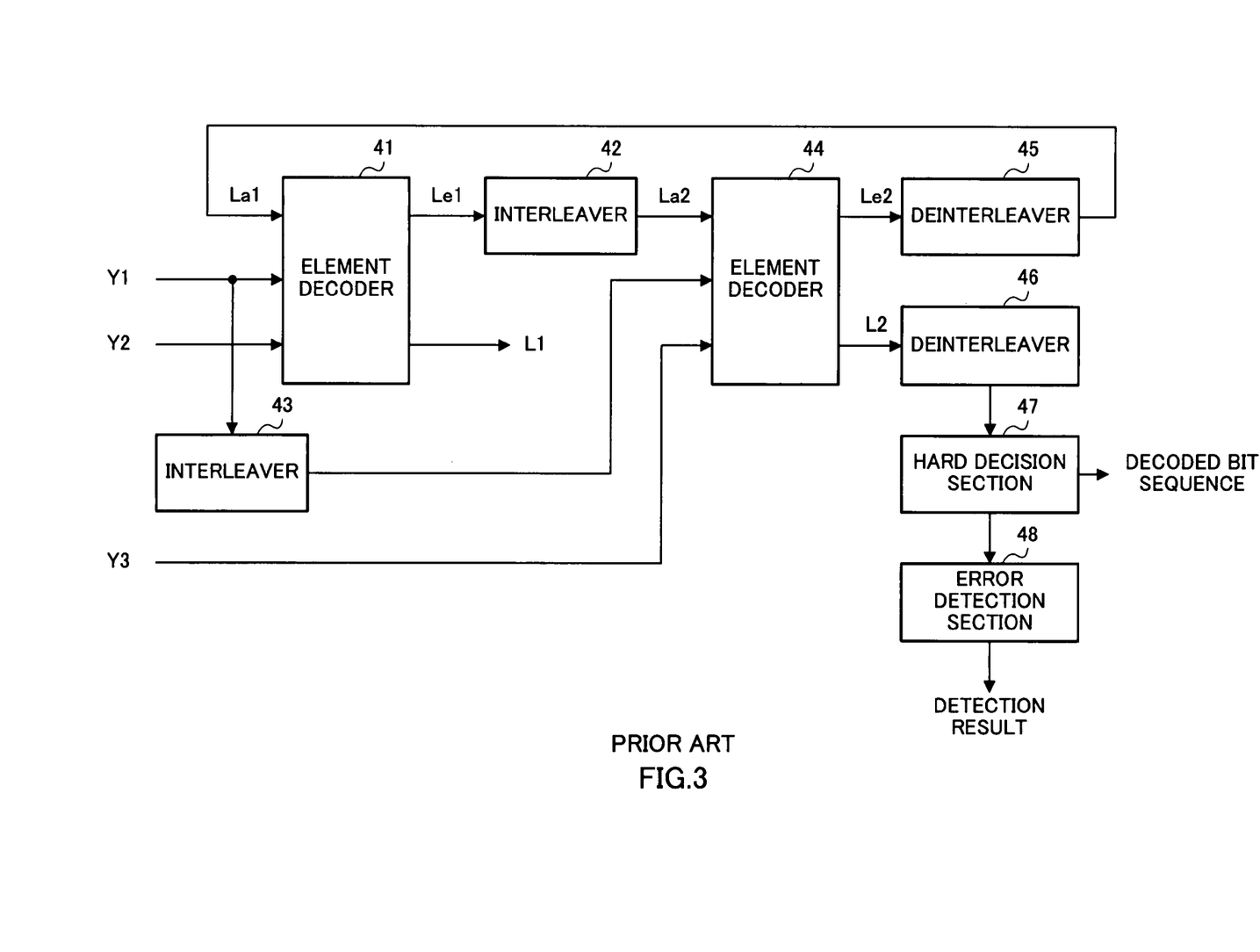
FIG. 3 is a block diagram showing the internal configuration of a decoder of a conventional OFDM reception apparatus.

FIG. 3 is a block diagram showing the internal configuration of decoder 30 of OFDM reception apparatus 20. The received signal sequences have noise (assumed to be additive white Gaussian noise here) and correspond to a systematic bit and a parity bit respectively. These received signal sequences are input to decoder 30.

Element decoder 41 performs decoding processing on the received signal sequence corresponding to systematic bit sequence X1 (hereinafter referred to as "systematic part Y1") and the received signal sequence corresponding to parity bit sequence X2 (hereinafter referred to as "parity part Y2") together with a priori value La1 which is reliability information transmitted from deinterleaver 45 and outputs external value Le1 to interleaver 42. The external value indicates the increase in symbol reliability by the element decoder. External value Le1 is rearranged by interleaver 42 and input to element decoder 44 as a priori value La2. Note that decoding by element decoder 44 is not performed in a first iteration, and therefore 0 is assigned as a priority value.

Element decoder 44 receives a sequence obtained by rearranging systematic part Y1 by interleaver 43, the received signal sequence corresponding to parity bit sequence X3 (hereinafter referred to as "parity part Y3") and a priori value La2, performs decoding processing on them and outputs external value Le2 to deinterleaver 45. External value Le2 is subjected to an operation by deinterleaver 45 of restoring the order before rearranged by the interleaver, input to element decoder 41 as a priority value La1 and decoded repeatedly. After being decoded several or over ten times repeatedly, element decoder 44 calculates a posteriori value L2 defined as a logarithmic posterior probability ratio and deinterleaver 46 deinterleaves the calculation result. Hard decision section 47 then performs hard decision on the deinterleaved sequence, outputs the decoded bit sequence, and error detection section 48 performs error detection on the decoded bit sequence and outputs the detection result.

Non-Patent Document 1: C. Berrou, A. Glavieux "Near Optimum Error Correcting Coding And Decoding: Turbo-Codes," IEEE Trans. Commun., Vol. 44, pp. 1261-1271, October 1996.

DISCLOSURE OF INVENTION

Problems to be Solved by the Invention

However, the above described conventional turbo decoder has the following problems. The soft information bits of the systematic part and parity parts are quantized uniformly without any distinction between the systematic part and parity parts, and therefore the number of bits input to the turbo decoder is fixed and the same number of bits of systematic part Y1, parity parts Y2 and Y3 are input to the turbo decoder. The circuit scale of the turbo decoder largely depends on the memory capacity used for decoding calculations, and requires a memory capacity in accordance with the number of bits input to the turbo decoder. Therefore, there is a problem that it is not possible to reduce the memory capacity or the circuit scale. The coding rate may be increased to reduce the memory capacity, but in such a case, data of the parity parts may be reduced and the error rate characteristic also deteriorates, and therefore the circuit scale cannot be reduced.

Furthermore, in the actual system, the coding rate and coding block length are variable, and therefore the system requires a minimum coding rate defined by the system and a memory capacity capable of responding to a longest block length, but all the memory capacity is not always used, which results in a problem that there remains a free space and memory is not used effectively.

It is therefore an object of the present invention to provide an input control apparatus and input control method that suppress characteristic deterioration, reduce the circuit scale of a turbo decoder and allow effective use of the memory of the turbo decoder.

MEANS FOR SOLVING THE PROBLEM

The input control apparatus of the present invention adopts a configuration having a bit number reduction section that reduces the number of bits of a systematic part and the number of bits of parity parts having a plurality of sequences input to a turbo decoder and a control section that controls the bit number reduction section so that the number of bits of one sequence of the parity parts falls below the number of bits of the systematic part.

According to this configuration, the number of bits is reduced so that the number of bits of one sequence of the parity parts input to the turbo decoder falls below the number of bits of the systematic part, and it is thereby possible to perform a decoding calculation of the turbo decoder with a smaller number of bits and reduce the memory capacity used for this calculation.

ADVANTAGEOUS EFFECT OF THE INVENTION

With regard to the number of bits input to the turbo decoder, the present invention can reduce the memory capacity of the turbo decoder and thereby reduce the circuit scale by reducing the number of bits of one sequence of the parity parts compared to the number of bits of the systematic part. Furthermore, the present invention enables effective use of memory by changing the number of bits of the systematic part and the number of bits of the parity parts input to the turbo decoder in accordance with a coding rate and/or coding block length.

BEST MODE FOR CARRYING OUT THE INVENTION

Now, an embodiment of the present invention will be explained with reference to the attached drawings.

Embodiment 1

Figure 4:
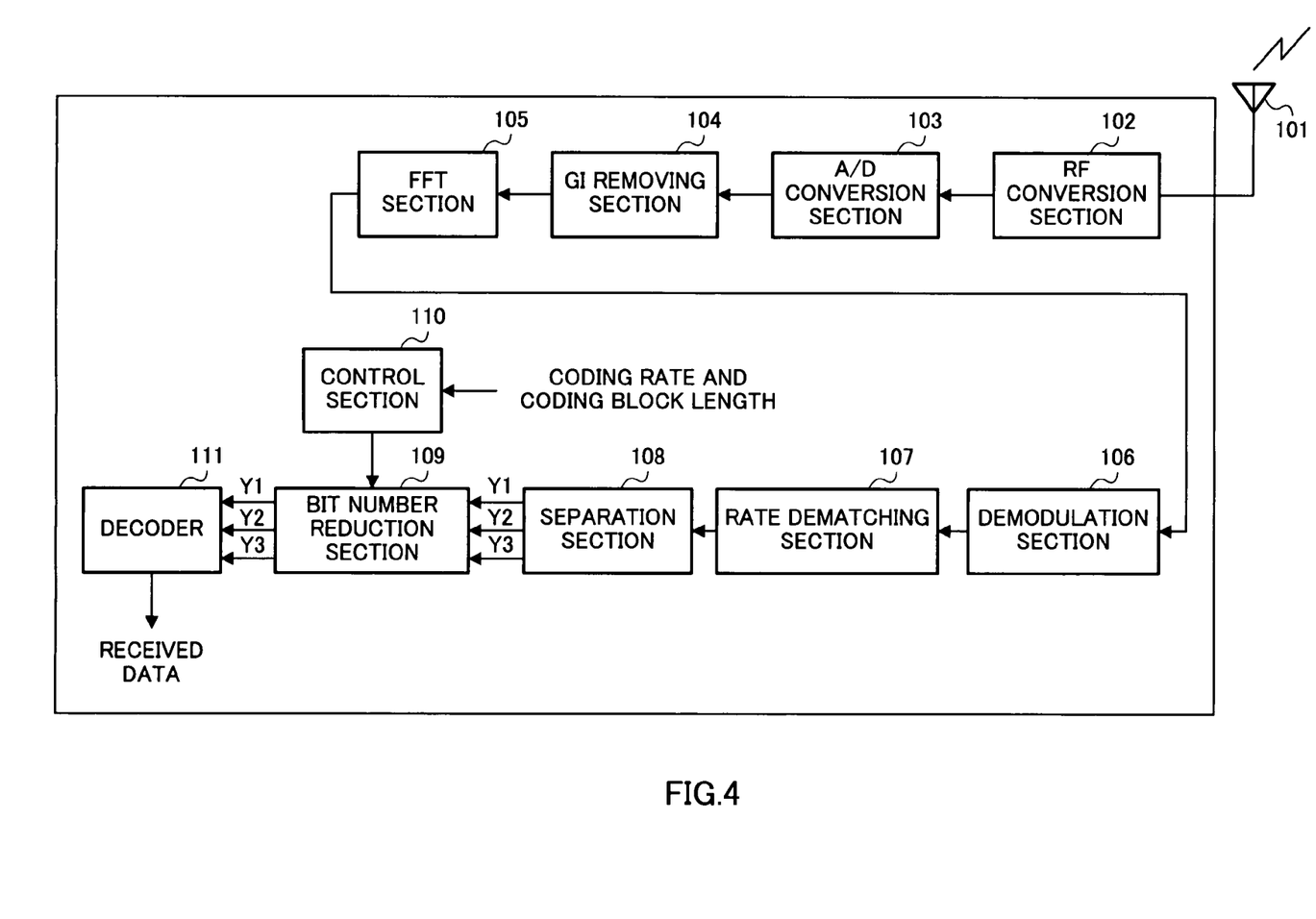
FIG. 4 is a block diagram showing the configuration of an OFDM reception apparatus according to Embodiment 1 of the present invention.

FIG. 4 is a block diagram showing the configuration of an OFDM reception apparatus according to Embodiment 1 of the present invention. In this figure, a signal transmitted from a transmission apparatus is received by antenna 101 and output to RF (Radio Frequency) conversion section 102.

RF conversion section 102 down-converts the frequency of a signal received by antenna 101 from a radio frequency to an intermediate frequency and separates it into signals of I component and Q component channels (quadrature detection). The signals separated into the I component and Q component channels are output to A/D conversion section 103 respectively.

A/D conversion section 103 converts the signal output from RF conversion section 102 from an analog signal to a digital signal and outputs the digital signal to GI (Guard Interval) removing section 104.

GI removing section 104 deletes a guard interval from the signal output from A/D conversion section 103 and outputs the signal from which the guard interval has been deleted to FFT (Fast Fourier Transform) section 105.

FFT section 105 applies a fast Fourier transform to the signal output from GI removing section 104 and separates the signal into sequences in subcarrier units. The separated signals are output to demodulation section 106.

Demodulation section 106 demodulates the signal output from FFT section 105, and rate dematching section 107 performs rate dematching processing on the demodulated signal and outputs the signal to separation section 108.

Separation section 108 separates the signal output from rate dematching section 107 into a sequence of the received signal corresponding to a systematic bit sequence (hereinafter referred to as "systematic part Y1") and a sequence of the received signal corresponding to a parity bit (hereinafter referred to as "parity part") and outputs the respective separated sequences to bit number reduction section 109. The parity parts are separated into parity parts Y2 and Y3 corresponding to parity bit sequences X2 and X3 respectively. Here, suppose the separated sequences have the same number of bits, which is K bits.

Bit number reduction section 109 reduces respectively the number of bits of systematic part Y1 and parity parts Y2 and Y3 output from separation section 108 under the control of control section 110. Systematic part Y1, and parity parts Y2 and Y3 with a reduced number of bits are output to decoder 111. Suppose the number of bits of systematic part Y1 output to decoder 111 is M bits and the number of bits of parity parts Y2 and Y3 output to decoder 111 is L bits respectively.

Control section 110 acquires information on the coding rate and coding block length of the received signal, determines the number of bits of systematic part Y1, and parity parts Y2 and Y3 in accordance with the coding rate and/or coding block length so that the number of bits L of one sequence of the parity parts falls below the number of bits M of systematic part Y1, and controls bit number reduction section 109 so that the determined number of bits is obtained. More specifically, control section 110 performs control so that when the coding rate is low, the number of bits L of the parity parts decreases and when the coding rate is high, the number of bits L of the parity parts increases. On the other hand, control section 110 performs control such that when the coding block length is short, the number of bits L of the parity parts increases and when the coding block length is long, the number of bits L of the parity parts decreases. This makes it possible to reduce the range of variation in the number of bits per block input to the turbo decoder, thereby reducing the unused, free space of memory and enabling effective use of memory.

Decoder 111 performs channel decoding (turbo decoding) on the signal output from bit number reduction section 109 and obtains received data.

Here, the method whereby control section 110 determines the number of bits input to decoder 111 will be explained. Control section 110 has the following general control equation:

$$M,L=f(R,N_{block})$$ (Equation 1)

M: Number of bits of systematic part Y1
L: Number of bits of parity parts Y2 and Y3
R: Coding rate
$N_{block}$: Coding block length In above Equation (1), if M is fixed and L is expressed as a function of R, L can be expressed by the following equation:

$$L=int[M \times (1-\log_3 3R)]$$ (Equation 2)

where, int is a maximum integer that does not exceed the value of the equation in parentheses. In Equation (2), if, for example, R=1, then L=0. In this equation, when coding rate R is low, the number of bits L of the parity parts increases and when the coding rate R is high, the number of bits L of the parity parts decreases.

Furthermore, M and L can be obtained using the following method. That is, when certain integer C is used, M can be expressed by following Equation (3) and L can be expressed by Equation (4):

$$M = int\left[C \times \frac{N_{max}}{N_{block}}\right]$$ (Equation 3)

$$L=M-H$$ (Equation 4)

where, $N_{max}$ is a maximum coding block length. Furthermore, suppose H is an integer and satisfies 0<H<=M. In this Equation (3), M and L increase as $N_{block}$ decreases and M and L decrease as $N_{block}$ approximates to $N_{max}$. For example, when $N_{block}=N_{max}/2$, M=2×C, and L=M-H.

Thus, control section 110 determines the number of bits of systematic part Y1, and parity parts Y2 and Y3 input to decoder 111.

Figure 5:
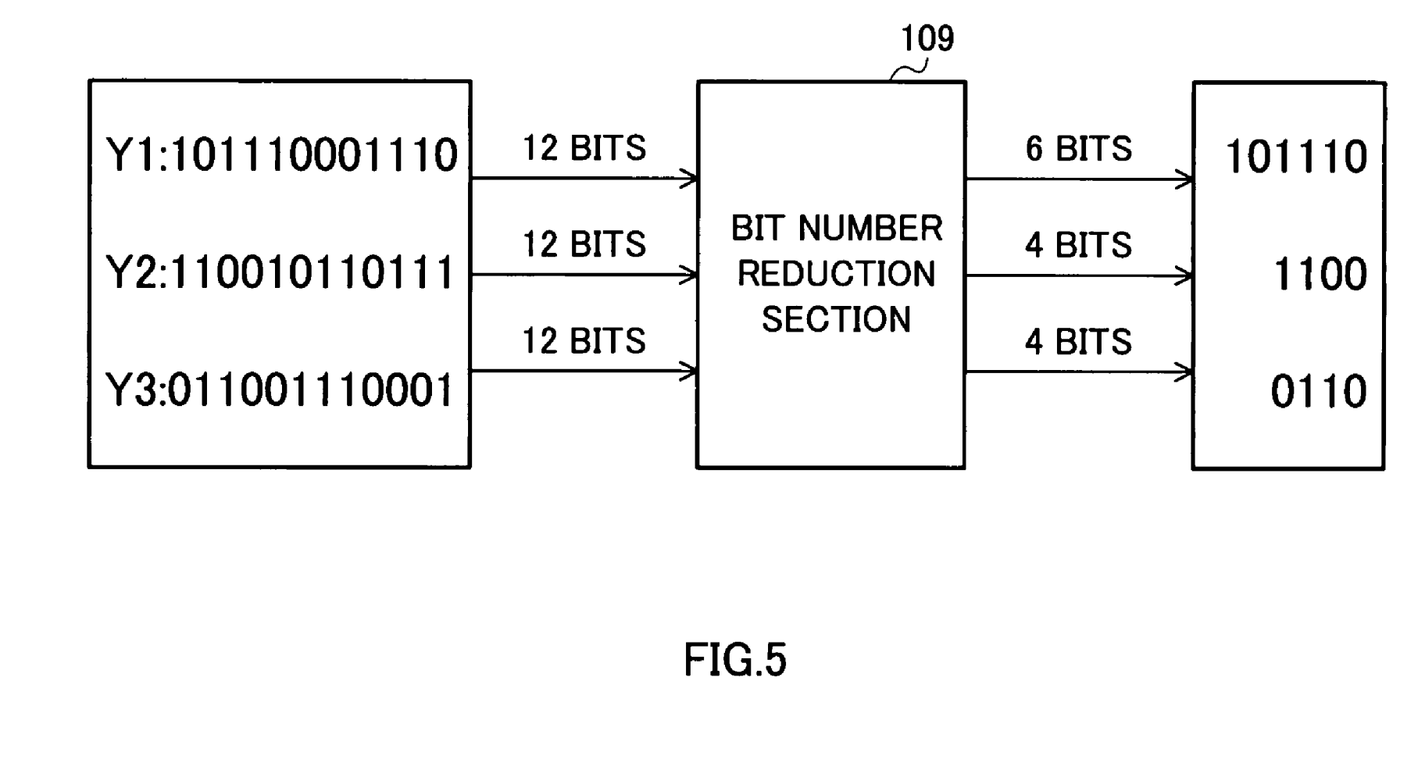
FIG. 5 illustrates a bit number reduction section.

Next, bit number reduction section 109 will be explained more specifically. FIG. 5 illustrates bit number reduction section 109. In this figure, suppose the bit sequence of systematic part Y1 output from separation section 108 is 12 bits of "101110001110" and the bit sequence of parity part Y2 is 12 bits of "110010110111." Likewise, suppose the bit sequence of parity part Y3 is 12 bits of "011001110001."

Bit number reduction section 109, controlled by control section 110, deletes bits of each input bit sequence so that systematic part Y1 is 6 bits, parity part Y2 is 4 bits and parity part Y3 is 4 bits. This causes the bit sequence of systematic part Y1 output from bit number reduction section 109 to become "101110", the bit sequence of parity part Y2 to become "1100" and the bit sequence of parity part Y3 to become "0110."

Thus, in turbo decoding, bit number reduction section 109 causes one sequence of the parity parts which have a lower degree of significance than that of the systematic part to have a smaller number of bits than the systematic part. This allows decoding calculation of the turbo decoder to be performed with a smaller number of bits, thereby reducing the memory capacity. Note that bit number reduction section 109 deletes the lower bits and outputs the higher bits out of the input bits.

Figure 6:
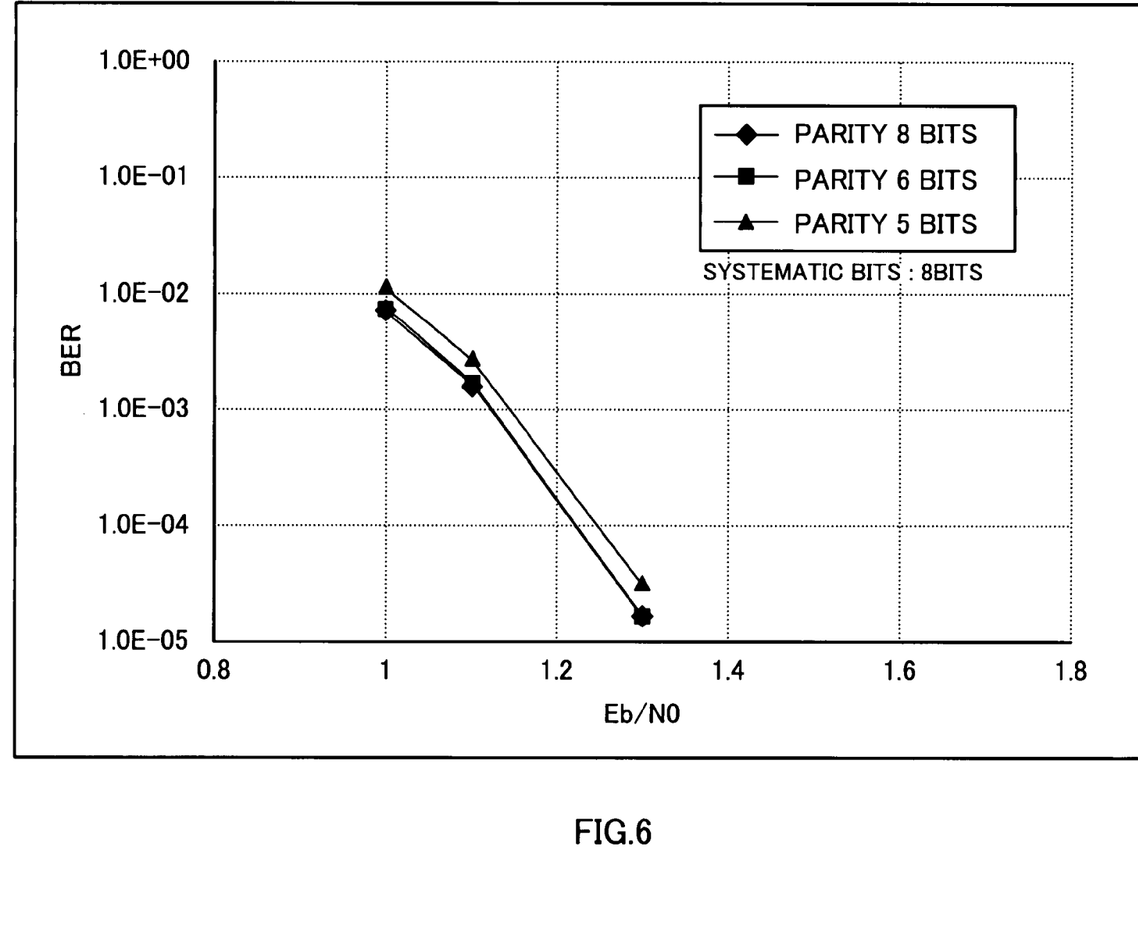
FIG. 6 illustrates a simulation result of the OFDM reception apparatus according to Embodiment 1 of the present invention.

FIG. 6 shows a simulation result of the OFDM reception apparatus according to Embodiment 1 of the present invention. Here, the simulation specifications are as follows:
Number of subcarriers: 1024
Spreading factor: 8
Modulation scheme (data): QPSK
Turbo block length: 3196
Channel coding: Turbo code (R=⅓, K=4) K: constraint length, Max-Log-MAP decoding
Iteration count: 8
Channel model: AWGN In FIG. 6, the vertical axis shows a BER (Bit Error Rate) and the horizontal axis shows Eb/N0. Furthermore, suppose the number of bits of the systematic part is 8 bits and the number of bits of the parity parts has three patterns, namely 5, 6, and 8 bits. As is obvious from this figure, the characteristics when the number of bits of the parity part is 6 bits and 8 bits are completely the same and even when the number of bits of the parity part is 5 bits, deterioration is only approximately 0.05 [dB] with a BER of 1.0E−04. This is because the turbo decoder performs iteration decoding and achieves a high decoding characteristic. However, when the number of bits of the parity parts is too small, it is also not possible to realize a high decoding characteristic, and therefore it is necessary to reduce the memory capacity and avoid characteristic deterioration.

Thus, according to this embodiment, with regard to the number of bits input to the turbo decoder, it is possible to reduce the memory capacity of the turbo decoder and thereby reduce the circuit scale by reducing the number of bits of one sequence of the parity parts compared to the number of bits of the systematic part. Furthermore, it is possible to effectively use memory by changing the number of bits of the systematic part and the number of bits of the parity parts input to the turbo decoder in accordance with the coding rate and/or coding block length.

This embodiment has explained the case where the turbo decoder is mounted on an OFDM reception apparatus as an example, but the present invention is not limited to this and is also applicable to cases where the turbo decoder is mounted on a reception apparatus using optical communication or a reproduction apparatus such as a magnetic disk and an optical disk. Furthermore, not only a turbo code but also a convolutional code can be used.

A first aspect of the present invention is an input control apparatus having a bit number reduction section that reduces the number of bits of a systematic part and the number of bits of parity parts having a plurality of sequences input to a turbo decoder and a control section that controls the bit number reduction section so that the number of bits of one sequence of the parity parts falls below the number of bits of the systematic part.

According to this configuration, by reducing the number of bits of the systematic part and the number of bits of the parity parts input to the turbo decoder so that the number of bits of one sequence of the parity parts falls below the number of bits of the systematic part, it is possible to perform a decoding calculation of the turbo decoder with a smaller number of bits, thereby reducing the memory capacity used for this calculation.

A second aspect of the present invention is the input control apparatus in the above described aspect, wherein the control section controls the bit number reduction section so that the number of bits of the parity parts is obtained in accordance with a coding rate and/or coding block length of a bit sequence input to the turbo decoder.

According to this configuration, by reducing the number of bits of the systematic part and the number of bits of the parity parts so that the number of bits of the parity parts is obtained in accordance with the coding rate and/or coding block length of the bit sequence input to the turbo decoder, it is possible to reduce the range of variation in the number of bits per block input to the turbo decoder, thereby reducing unused, free space of memory and enabling effective use of memory.

A third aspect of the present invention is the input control apparatus in the above described aspect, wherein the control section performs control so that the number of bits of the parity parts decreases as the coding rate of the bit sequence input to the turbo decoder decreases and the number of bits of the parity parts increases as the coding rate increases.

According to this configuration, the number of bits of the parity parts decreases where the number of bits used for decoding increases as the coding rate decreases, the number of bits of the parity parts increases where the number of bits used for decoding decreases as the coding rate increases, and it is possible to thereby reduce the range of variation in the number of bits per block input to the turbo decoder, reduce unused free space of memory and effectively use memory.

A fourth aspect of the present invention is the input control apparatus of the above described aspect, wherein the control section performs control so that the number of bits of the parity parts decreases as the coding block length input to the turbo decoder increases and the number of bits of the parity parts increases as the coding block length decreases.

According to this configuration, the control section controls the bit number reduction section so that the number of bits of the parity parts decreases as the coding block length increases and the number of bits of the parity parts increases as the coding block length decreases, and it is possible to thereby reduce the range of variation in the number of bits per block input to the turbo decoder, reduce unused free space of memory and effectively use memory.

A fifth aspect of the present invention is an input control method having the step of reducing the number of bits of a systematic part and the number of bits of parity parts so that the number of bits of one sequence of the parity parts falls below the number of bits of the systematic part out of the systematic part and parity parts having a plurality of sequences input to a turbo decoder.

According to this method, by reducing the respective numbers of bits in accordance with the coding rate and/or coding block length of the bit sequence input to the turbo decoder and so that the number of bits of one sequence of the parity parts falls below the number of bits of the systematic part, it is possible to reduce the range of variation in the number of bits per block input to the turbo decoder, thereby reducing unused free space of memory and enabling effective use of memory. Furthermore, it is possible to perform a decoding calculation of the turbo decoder with a smaller number of bits and thereby reduce the memory capacity used for this calculation.

The present application is based on Japanese Patent Application No. 2003-333489 filed on Sep. 25, 2003, entire content of which is expressly incorporated by reference herein.

INDUSTRIAL APPLICABILITY

With regard to the number of bits input to a turbo decoder, the input control apparatus and input control method according to the present invention has the effect of reducing the memory capacity of the turbo decoder by reducing the number of bits of one sequence of parity parts compared to the number of bits of a systematic part, and the effect of enabling effective use of memory by changing the number of bits of the systematic part and the number of bits of the parity parts input to the turbo decoder in accordance with a coding rate and/or coding block length, and is suitable for use in an apparatus having a turbo decoder such as a reception apparatus using radio communication, reception apparatus using optical communication and reproduction apparatus such as a magnetic disk and optical disk.

The invention claimed is:

1. An input control apparatus comprising:
a receiving section that receives a signal including bits of a systematic part and bits of parity parts comprising a plurality of sequences, the signal being generated in an external transmission apparatus by turbo coding and puncturing information;
a rate dematching processing section that performs rate dematching processing on the received signal; and
a bit number reduction section that discards bits from the systematic part and bits from the parity parts so that the number of bits in each sequence of the parity parts is less than the number of bits in the systematic part, at a timing between the rate dematching processing and turbo decoding on the signal subjected to the rate dematching processing.

2. An input control apparatus comprising:
a receiving section that receives a signal including bits of a systematic part and bits of parity parts compromising a plurality of sequences, the signal being generated in an external transmission apparatus by turbo coding and puncturing information;
a rate dematching processing section that performs rate dematching processing on the received signal; and
a bit number reduction section that discards bits from the systematic art and bits from the parity parts so that the number of bits in each sequence of the parity parts is less than the number of bits in the systematic part, before performing turbo decoding on the signal subjected to the rate dematching processing, wherein
the bit number reduction section discards the bits from the systematic part and the bits from the parity parts so that the number of bits in the parity parts is determined in accordance with a coding rate and/or coding block length of a bit sequence received as input in a turbo decoder.

3. The input control apparatus according to claim 2, wherein the bit number reduction section discards the bits from the systematic part and the bits from the parity parts so that the number of bits in the parity parts decreases as the coding rate of the bit sequence received as input in the turbo decoder decreases and the number of bits in the parity parts increases as the coding rate increases.

4. The input control apparatus according to claim 2, wherein the bit number reduction section discards the bits from the systematic part and the bits from the parity parts so that the number of bits in the parity parts decreases as the coding block length received as input in the turbo decoder increases and the number of bits in the parity parts increases as the coding block length decreases.

5. An input control method comprising the steps of:

receiving a signal including bits of a systematic part and bits of parity parts comprising a plurality of sequences, the signal being generated in an external transmission apparatus by turbo coding and puncturing information;

performing rate dematching processing on the received signal; and discarding bits from the systematic part and bits from the parity parts so that the number of bits in each sequence of the parity parts is less than the number of bits in the systematic part, at a timing between the rate dematching processing and turbo decoding on the signal subjected to the rate dematching processing.

6. An input control method comprising the steps of:

receiving a signal including bits of a systematic part and bits of parity parts comprising a plurality of sequences, the signal being generated in an external transmission apparatus by turbo coding and puncturing information;

performing rate dematching processing on the received signal; and discarding bits from the systematic part and bits from the parity parts so that the number of bits in each sequence of the parity parts is less than the number of bits in the systematic part, before performing turbo decoding on the signal subjected to the rate dematching processing, wherein in the discarding, the bits from the systematic part and the bits from the parity parts are discarded so that the number of bits in the parity parts is determined in accordance with a coding rate and/or coding block length of a bit sequence received as input in a turbo decoder.

* * * * *